(12) United States Patent
Rowe et al.

(10) Patent No.: US 10,654,251 B2
(45) Date of Patent: May 19, 2020

(54) ULTRATHIN BARRIER LAMINATES AND DEVICES

(71) Applicant: 3M INNOVATIVE PROPERTIES COMPANY, St. Paul, MN (US)

(72) Inventors: David J. Rowe, Roseville, MN (US); Ta-Hua Yu, Woodbury, MN (US); Timothy J. Lindquist, Woodbury, MN (US); Mark A. Roehrig, Stillwater, MN (US); Christopher S. Lyons, St. Paul, MN (US); Stephen P. Maki, North St. Paul, MN (US); Scott J. Jones, Woodbury, MN (US); Kevin D. Hagen, St. Paul, MN (US); Andrew M. Mevissen, White Bear Lake, MN (US); Kenneth L. Looney, St. Paul, MN (US); Stephen A. Johnson, Woodbury, MN (US); Terence D. Neavin, Minneapolis, MN (US); Joseph C. Spagnola, Woodbury, MN (US); Fred B. McCormick, Maplewood, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 50 days.

(21) Appl. No.: 15/739,168

(22) PCT Filed: Jun. 24, 2016

(86) PCT No.: PCT/US2016/039280
§ 371 (c)(1),
(2) Date: Dec. 22, 2017

(87) PCT Pub. No.: WO2017/003870
PCT Pub. Date: Jan. 5, 2017

(65) Prior Publication Data
US 2018/0370200 A1      Dec. 27, 2018

Related U.S. Application Data

(60) Provisional application No. 62/185,903, filed on Jun. 29, 2015.

(51) Int. Cl.
*B32B 27/08* (2006.01)
*B32B 27/36* (2006.01)
(Continued)

(52) U.S. Cl.
CPC ............ *B32B 27/08* (2013.01); *B32B 7/06* (2013.01); *B32B 27/36* (2013.01); *H01L 51/448* (2013.01);
(Continued)

(58) Field of Classification Search
CPC ... B32B 27/08; B32B 27/36; B32B 2457/206; B32B 7/06; B32B 2307/7246; H01L 51/448; H01L 51/5253; H01L 2227/326
See application file for complete search history.

(56) References Cited

U.S. PATENT DOCUMENTS 5,032,461 A    7/1991  Shaw
5,440,446 A    8/1995  Shaw
(Continued)

FOREIGN PATENT DOCUMENTS

CN    104684727 A     6/2015
JP    2007-118564 A   5/2007
(Continued)

OTHER PUBLICATIONS

Danforth, "UV-Curable Top Coat Protection Against Mechanical Abrasion for Atomic Layer Deposition (ALD) Thin Film Barrier Coatings", Surface & Coatings Technology, 2014, vol. 241, pp. 142-147.

(Continued)

*Primary Examiner* — Michael C Miggins
(74) *Attorney, Agent, or Firm* — Yufeng Dong

(57) ABSTRACT

Barrier assemblies including ultrathin barrier laminates and methods of making the barrier assemblies are provided. A barrier assembly includes a thermoplastic polymer skin layer (Continued)

having opposite first and second major surfaces, and a barrier stack coated on the first major surface of the thermoplastic polymer skin layer to form an integral protective layer having a thickness no greater than about 0.5 mil (about 12.7 microns). The removable carrier film has a major surface releasably attached to the second major surface of the thermoplastic polymer skin layer. In some cases, the removal of the carrier film results in ultrathin barrier laminates.

18 Claims, 4 Drawing Sheets

(51) Int. Cl.
    *H01L 51/44* (2006.01)
    *H01L 51/52* (2006.01)
    *B32B 7/06* (2019.01)

(52) U.S. Cl.
    CPC .. *H01L 51/5253* (2013.01); *B32B 2307/7246* (2013.01); *B32B 2457/206* (2013.01); *H01L 2227/326* (2013.01)

(56) References Cited

U.S. PATENT DOCUMENTS

| | | |
|---|---|---|
| 5,877,895 A | 3/1999 | Shaw |
| 6,010,751 A | 1/2000 | Shaw |
| 6,231,939 B1 | 5/2001 | Shaw |
| 7,018,713 B2 | 3/2006 | Padiyath |
| 7,486,019 B2 | 2/2009 | Padiyath |
| 7,940,004 B2 | 5/2011 | Padiyath |
| 7,980,910 B2 | 7/2011 | Padiyath |
| 8,179,381 B2 | 5/2012 | Frey |
| 8,187,679 B2 | 5/2012 | Dickey |
| 8,663,407 B2 | 3/2014 | Joly |
| 2003/0029493 A1 | 2/2003 | Plessing |
| 2004/0195967 A1 | 10/2004 | Padiyath |
| 2011/0105637 A1 | 5/2011 | Fujita |
| 2012/0003451 A1 | 1/2012 | Weigel |
| 2014/0065397 A1 | 3/2014 | Johnson |
| 2014/0242736 A1 | 8/2014 | Dickey |

FOREIGN PATENT DOCUMENTS

| | | |
|---|---|---|
| JP | 4010399 | 11/2007 |
| WO | WO 2011-086500 | 7/2011 |
| WO | WO 2012-003416 | 1/2012 |
| WO | WO 2013-025330 | 2/2013 |
| WO | WO 2014-025384 | 2/2014 |
| WO | WO 2014-028677 | 2/2014 |
| WO | WO 2014-028678 | 2/2014 |
| WO | WO 2014-113562 | 7/2014 |

OTHER PUBLICATIONS

International Search Report for PCT International Application No. PCT/US2016/039280, dated Sep. 19, 2016, 4 pages.

ULTRATHIN BARRIER LAMINATES AND DEVICES

CROSS REFERENCE TO RELATED APPLICATIONS

This application is a national stage filing under 35 U.S.C. 371 of PCT/US2016/039280, filed Jun. 24, 2016, which claims the benefit of U.S. Application No. 62/185,903 filed Jun. 29, 2015, the disclosure of which is incorporated by reference in its/their entirety herein.

TECHNICAL FIELD

The present disclosure relates to ultrathin barrier laminates and methods of making and using the same.

BACKGROUND

Many electronic devices such as organic light emitting diodes (OLEDs), organic and inorganic photovoltaics (PV), quantum dot (QD) devices require protection from oxygen and/or water ingress. Barrier coatings or films have been developed to protect electronic devices, for example, in the field of flexible electronics. Available barrier coatings or films generally are a stack of continuous layers including a substrate and a barrier film overlaying the substrate, where the substrate and barrier film as a whole can provide protection for electronic devices.

SUMMARY

There is a need to reduce the thickness of barrier coatings or films. However, web handling and converting thin continuous films may become more difficult as the substrate thickness decreases. For example, maintaining web tensions and managing thermal loads and expansion of the web may lead to wrinkling and binding of thin substrates in a roll-to-roll coating process. The present disclosure provides barrier assemblies including ultrathin barrier laminates and methods of making the same that can overcome the above challenges.

Briefly, in one aspect, the present disclosure describes an article including a thermoplastic polymer skin layer having opposite first and second major surfaces, and a barrier stack coated on the first major surface of the skin layer. The thermoplastic polymer skin layer and the barrier stack form an integral protective layer, and the integral protective layer has a thickness no greater than about 0.5 mil (12.7 microns). A removable carrier film has a major surface releasably attached to the second major surface of the thermoplastic polymer skin layer. The removable carrier film is configured to support the integral protective layer.

In another aspect, the present disclosure describes an optoelectronic device having a major surface. A thermoplastic polymer skin layer has opposite first and second major surfaces, and a barrier stack is coated on the first major surface of the thermoplastic polymer skin layer. The thermoplastic polymer skin layer and the barrier stack form an integral protective layer. The integral protective layer has a thickness no greater than about 0.5 mil (12.7 microns). The barrier stack of the integral protective layer is attached to the major surface of the optoelectronic device.

In another aspect, the present disclosure describes a method including providing a removable carrier film having a major surface, and providing a thermoplastic polymer skin layer disposed on the major surface of the removable carrier film. The thermoplastic polymer skin layer has opposite first and second major surfaces, and the second major surface of the thermoplastic polymer skin layer is releasably attached to the major surface of the removable carrier film. A barrier stack is coated on the first major surface of the skin layer. The thermoplastic polymer skin layer and the barrier stack form an integral protective layer having a thickness no greater than about 0.5 mil (12.7 microns).

Various unexpected results and advantages are obtained in exemplary embodiments of the disclosure. One such advantage of exemplary embodiments of the present disclosure is that barrier assemblies having one or more strippable or removable layers which can be removed and result in ultrathin laminated barrier structures at end use, while at the same time, the thicker, multi-layered structure of the barrier assemblies can enable web handling and coating in roll-to-roll processes.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
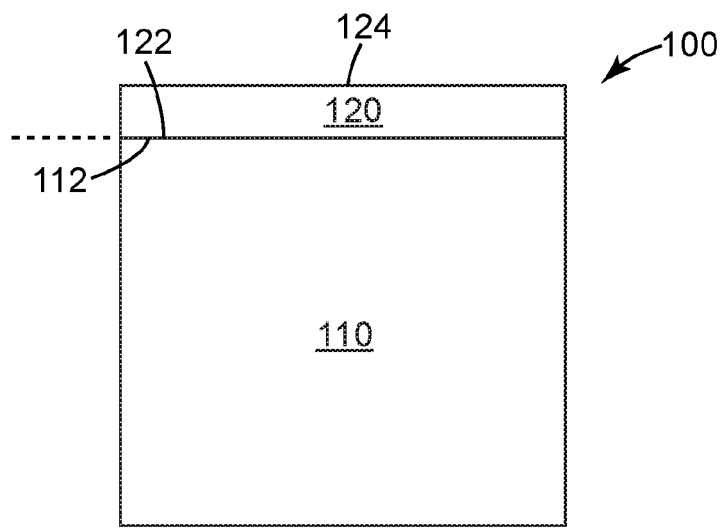
FIG. 1 is a schematic side view of a multi-layer film, according to one embodiment.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

The term "homogeneous" means exhibiting only a single phase of matter when observed at a macroscopic scale.

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

The term "adjoining" with reference to a particular layer means joined with or attached to another layer, in a position wherein the two layers are either next to (i.e., adjacent to) and directly contacting each other, or contiguous with each other but not in direct contact (i.e., there are one or more additional layers intervening between the layers).

By using terms of orientation such as "atop", "on", "over", "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

By using the term "overcoated" to describe the position of a layer with respect to a substrate or other element of an article of the present disclosure, we refer to the layer as being atop the substrate or other element, but not necessarily contiguous to either the substrate or the other element.

By using the term "separated by" to describe the position of a layer with respect to other layers, we refer to the layer as being positioned between two other layers but not necessarily contiguous to or adjacent to either layer.

The terms "about" or "approximately" with reference to a numerical value or a shape means +/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

FIG. 1 illustrates a schematic cross-sectional view of a multi-layer film 100, according to one embodiment. The multi-layer film 100 includes a removable carrier film 110 and a thermoplastic polymer skin layer 120 disposed on the removable carrier film 110. The removable carrier film 110 has a major surface 112 that is separable from a major surface 122 of the thermoplastic polymer skin layer 120 such that the thermoplastic polymer skin layer 120 and the removable carrier film 110 can be delaminated from each other in continuous sheet form. Delamination may occur preferentially along a delamination surface which is the contacting surfaces 122 and 112 in this case (refer to the dashed line in FIG. 1). In some embodiments, the thermoplastic polymer skin layer 120 may be or include one or more thermoplastic polymers selected from the group consisting of polyester, polyolefin, polyacrylate, polyamide, polycarbonate, polyurethane, and polystyrene. In some embodiments, the thermoplastic polymer may include, for example, one or more of polyethylene terephthalate (PET), polystyrene, acrylonitrile butadiene styrene, polyvinyl chloride, polyvinylidene chloride, polycarbonate, polyacrylates, thermoplastic polyurethanes, polyvinyl acetate, polyamide, polyimide, polyethylene naphthalate (PEN), styrene acrylonitrile, silicone-polyoxamide polymers, fluoropolymers, cyclic olefin copolymers, etc.

Figure 2:
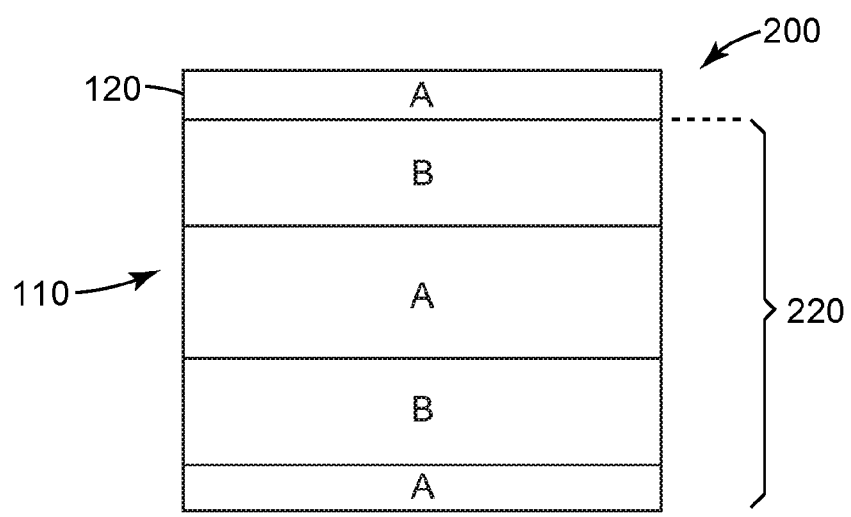
FIG. 2 is a schematic side view of a multi-layer film, according to one embodiment.

FIG. 2 illustrates an exemplary multi-layer film 200 including an exemplary removable carrier film 110 with an exemplary thermoplastic polymer skin layer 120 disposed thereon. The removable carrier film 110 includes individual polymer layers stacked together to form a stack 220 which may form all or part of the removable carrier film 110. In the depicted embodiment, the stack 220 includes two types of polymer layers: polymer layer A, and polymer layer B, which are assumed to be composed of different polymer compositions A and B, respectively. It is to be understood that the removable carrier film 110 and the thermoplastic polymer skin layer 120 may have other suitable structures and/or compositions.

In the embodiment of FIG. 2, the thermoplastic polymer skin layer 120 is also a polymer layer A that includes composition A, and the frontmost layer of the stack 220 adjacent the thermoplastic polymer skin layer 120 is a polymer layer B that includes composition B. The multi-layer film 200 including the thermoplastic polymer skin layer 120 and the stack 220 form a symmetric five-layer structure of A/B/A/B/A. It is to be understood that multi-layer film 200 may include other numbers of layers, for example, a three-layer structure of A/B/A, or more alternating A and B layers. It is also to be understood that the polymer compositions A and B can be ordered in other sequences as long as the removable carrier film 110 and the thermoplastic polymer skin layer 120 can be delaminated from each other.

In some embodiments, the polymer compositions A or B can include polyester-based materials. In some embodiments, polyester and non-polyester-based material combinations can be incorporated properly into layers B, or A, respectively, in the stack 220. In some embodiments, the polymer composition A may be, for example, a semi-crystalline polyester. In some embodiments, the polymer composition B may be, for example, a blend of propylene copolymer and styrenic block copolymer, or a blend of propylene copolymer and an ethylene alpha olefin copolymer, or a blend of propylene copolymer and an olefin block copolymer.

In some embodiments, the attachment between adjacent A and B layers may be substantially the same. That is, substantially the same amount of peel force can be applied to delaminate adjacent A and B layers. A portion or the whole of the stack 220 can be delaminated along any desired delamination surface corresponding to the respective interfaces between adjacent A and B layers. The removable carrier film 110 may be removed from the thermoplastic polymer skin layer 120 layer-by-layer.

In some embodiments, the stack 220 may be preferentially delaminated along the delamination interface between the adjacent layer 120 (e.g., polymer layer A) and the frontmost layer B of the stack 220 (refer to the dashed line in FIG. 2). The carrier film 110 as a whole can be removed from the thermoplastic polymer skin layer 120 along the delamination interface.

In some embodiments, the stack 220 may include one or more polymer layers C sandwiched by adjacent polymer layers A and B to form a structure of, for example, B/C/A/C/B/C/A where the frontmost layer B is removably attached to the thermoplastic polymer skin layer 120. The polymer layer C is an interlayer between the adjacent layers A and B and have a composition C being capable of enhancing the attachment between layers A and B. The polymer composition B may be or include a blend of propylene copolymer and styrenic block copolymer, and the polymer composition C may be or include an immiscible blend of copolyester and an olefin. The polymer composition B may be or include a blend of propylene copolymer and styrenic block copolymer, and the polymer composition C may be or include an amorphous copolyester, and the polymer composition A may be or include a semi-crystalline polyester. The polymer composition B may be miscible (at least in part) with the polymer composition C, while the polymer composition C is miscible (at least in part) with the polymer composition A, and the polymer composition B is not miscible with the polymer composition A.

In some embodiments, the frontmost layer (e.g., a polymer layer B) of the carrier film 110 may have a substantially weaker attachment to the thermoplastic polymer skin layer 120 than the attachment to the interior layer underlying the frontmost layer. The attachment of the thermoplastic polymer skin layer 120 to the frontmost polymer layer of the stack 220 may be characterized by a peel force in a range, for example, from 2 to 100 grams per inch. The attachment of the thermoplastic polymer skin layer 120 to the frontmost polymer layer of the stack 220 may be characterized by a first peel force. The attachment of the frontmost polymer layer of the stack 220 to the interior polymer layer underlying the frontmost polymer layer may be characterized by a second peel force. In some embodiments, for the stack 220 having a B/C/A configuration discussed above, the second peel force may be at least two times, or at least three times, the first peel force.

In some embodiments, the polymer composition B may be a miscible blend of propylene copolymer and styrenic block copolymer, or a miscible blend of propylene copolymer and an ethylene alpha olefin copolymer, or a miscible blend of propylene copolymer and an olefin block copolymer. In cases where the polymer composition B is a miscible blend of propylene copolymer and styrenic block copolymer, the polymer composition C may be an immiscible blend of copolyester and an olefin, or the polymer composition C may be an amorphous copolyester and the polymer composition A may be a semi-crystalline polyester.

Preferably, none of the polymer compositions A, B and C is pressure sensitive adhesives (PSAs), or other types of adhesives. Furthermore, polymer compositions A, B, and/or C of the multi-layer film 200 may be preferably coextrudable with each other, such that the entire layer stack 220 and the thermoplastic polymer skin layer 120 thereon can be coextruded in a single operation rather than being made in different operations and then later laminated together with an adhesive. Such coextruded polymer film configurations are described in US 2014/0065397 (Johnson et al.), which is incorporated by reference, to the extent they do not contradict the foregoing disclosure. It is to be understood that the removable carrier film 110 may include two or more stacks 220 that can be peeled away one by one.

In some embodiments, to ensure that the removable carrier film 110 and the thermoplastic polymer skin layer 120 do not simply fall apart, the attachment of the thermoplastic polymer skin layer 120 to the frontmost layer of the carrier film 110 (e.g., the upper layer B of the stack 220 of FIG. 2) is characterized by a peel force greater than zero, e.g., the peel force is preferably at least 1 gram/inch, or at least 2 grams/inch. Peel force units of grams/inch (or grams/inch width), abbreviated g/in, are sometimes referred to as grams per linear inch, abbreviated gli. 1 g/in equals 0.3860886 N/m.

In some embodiments, an optional premask may be attached to the carrier film 110 and used to help handling films in roll-to-roll processes such as, for example, jumbo roll winding and formation. It is to be understood that the premask is optional and the carrier film 110 can stand alone to support the thermoplastic polymer skin layer 120.

Figure 3A:
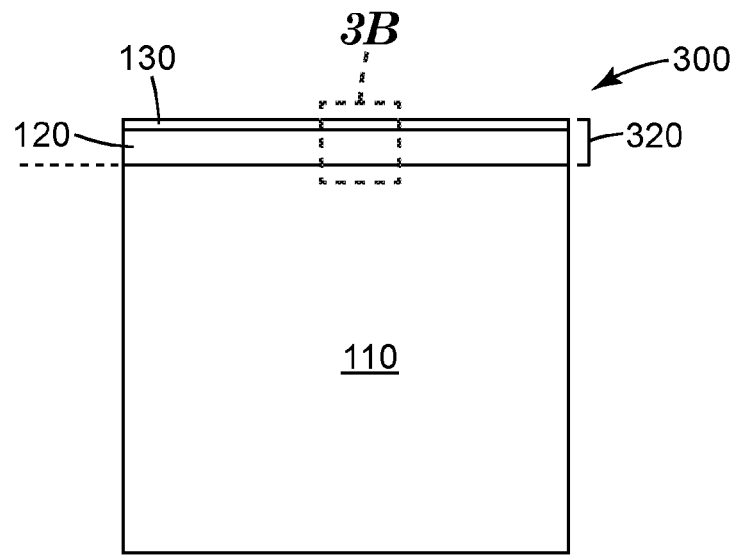
FIG. 3A is a schematic side view of a barrier assembly, according to one embodiment.
Figure 3B:
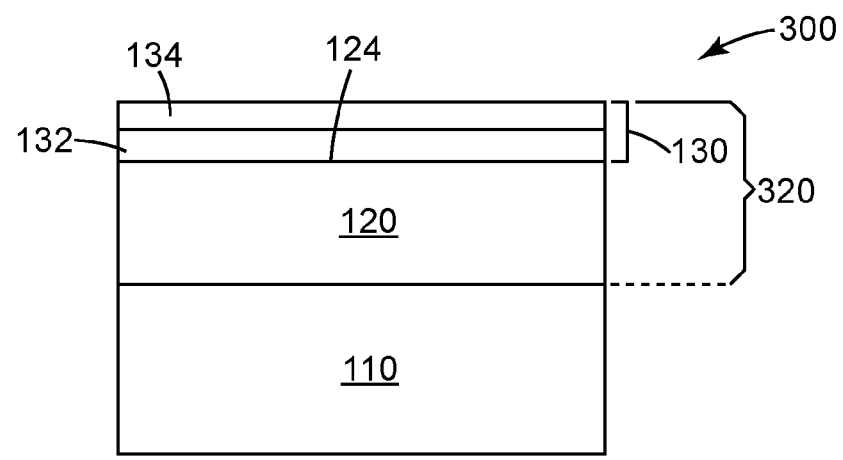
FIG. 3B is an enlarged portion of the barrier assembly of FIG. 3A.

FIGS. 3A and 3B illustrate a barrier assembly 300 including a barrier stack 130 disposed on the thermoplastic polymer skin layer 120 of the multi-layer film 100 of FIG. 1. The barrier stack 130 and the thermoplastic polymer skin layer 120 form an integral protective layer 320. It is to be understood that as an integral layer, the attachment of the barrier stack 130 to the thermoplastic polymer skin layer 120 is substantially stronger than the attachment of the removable carrier film 110 to the layer 120 such that the stack of layers in the barrier assembly 300 of FIGS. 3A-B tend to delaminate along delamination surfaces corresponding to the interfaces between the removable carrier film 110 and the thermoplastic polymer skin layer 120 (refer to the dashed lines in FIGS. 3A-B).

Integral protective layers such as the integral protective layer 320 including one or more of the barrier stack 130 and one or more of the thermoplastic polymer skin layer 120 can be typically formed such that they have oxygen and water vapor transmission rates at a specified level as required by the application so as to provide protection from oxygen and/or water ingress. In some embodiments, the integral protective layer 320 may have a water vapor transmission rate (WVTR) less than about 0.005 g/m$^2$/day at 38° C. and 100% relative humidity; in some embodiments, less than about 0.0005 g/m$^2$/day at 38° C. and 100% relative humidity; and in some embodiments, less than about 0.00005 g/m$^2$/day at 38° C. and 100% relative humidity. In some embodiments, the integral protective layer 320 may have a WVTR of less than about 0.05, 0.005, 0.0005, or 0.00005 g/m$^2$/day at 50° C. and 100% relative humidity or even less than about 0.005, 0.0005, 0.00005 g/m$^2$/day at 85° C. and 100% relative humidity. In some embodiments, the integral protective layer 320 may have an oxygen transmission rate of less than about 0.005 cm$^3$/m$^2$/day at 23° C. and 90% relative humidity; in some embodiments, less than about 0.0005 cm$^3$/m$^2$/day at 23° C. and 90% relative humidity; and in some embodiments, less than about 0.00005 cm$^3$/m$^2$/day at 23° C. and 90% relative humidity.

In some embodiments, the integral protective layer 320 may have a thickness, for example, no greater than about 2 mil (50.8 microns), no greater than about 1 mil (25.4 microns), no greater than about 0.5 mil (12.7 microns), no greater than about 0.4 mil (10.2 microns), or no greater than about 0.3 mil (7.6 microns); in some embodiments, no less than about 0.005 mil (0.127 microns), no less than about 0.01 mil (0.254 microns), no less than about 0.05 mil (1.27 microns), or no less than about 0.1 mil (2.54 microns). The thickness of integral protective layer 320 can be in the range, for example, from about 0.01 mil (0.254 microns) to about 0.5 mil (12.7 microns), from about 0.05 mil (1.27 microns) to about 0.5 mil (12.7 microns), or from about 0.1 mil (2.54 microns) to about 0.5 mil (12.7 microns).

The integral protective layer 320 includes the barrier stack 130 and the thermoplastic polymer skin layer 120. In some embodiments, the thickness of the barrier stack 130 may be, for example, no greater than about 50 microns, no greater than 20 microns, no greater than 10 microns, no greater than 5 microns, or no greater than 3 microns. In some embodiments, the thickness of barrier stack 130 may be no less than 5 nm, no less than 10 nm, no less than 50 nm, no less than 100 nm, or no less than 200 nm. The thickness of barrier stack 130 may be, for example, from about 100 nm to about 5 microns. In some embodiments, the thickness of the thermoplastic polymer skin layer 120 may be, for example, no greater than about 0.5 mil (12.7 microns), no greater than about 0.4 mil (10.2 microns), no greater than about 0.3 mil (7.6 microns), no greater than about 0.2 mil (5.1 microns), or no greater than about 0.1 mil (2.54 microns). In some embodiments, the thickness of the thermoplastic polymer skin layer 120 may be no less than about 50 nm, no less than about 100 nm, no less than about 200 nm, no less than about 400 nm, or no less than 600 nm. The thickness of thermoplastic polymer skin layer 120 may be in the range, for example, from about 0.01 mil (0.254 microns) to about 0.4 mil (10.2 microns).

In some embodiments, the removable carrier film 110 may be at least 2 times, at least 5 times, at least 10 times, at least 20 times, at least 50 times, or at least 100 times thicker than the integral protective layer 320. In some embodiments, the removable carrier film 110 may have a thickness no greater than about 10 mil (254 microns), no greater than about 6 mil (152 microns), no greater than about 4 mil (102 microns), or no greater than about 2 mil (51 microns). In some embodiments, the removable carrier film 110 may have a thickness no less than about 100 nm, no less than about 0.01 mil (254 nm), no less than about 0.05 mil (1.27 microns), or no less than about 0.1 mil (2.54 microns). The thickness of removable carrier film 110 can be in the range, for example, from about 0.1 mil (2.54 microns) to about 4 mil (102 microns).

In the depicted embodiment in FIG. 3B, the barrier stack 130 includes a polymer layer 132 and an inorganic barrier layer 134. The polymer layer 132 is in direct contact with the thermoplastic polymer skin layer 120 on the side opposite to the removable carrier film 110. The polymer layer 132 may be formed by applying a polymeric material to a major surface 124 (see also FIG. 1) of the thermoplastic polymer skin layer 120. In some embodiments, the polymer layer 132 may be formed by applying a layer of a monomer or oligomer and crosslinking the layer to form the polymer in situ, for example, by evaporation and vapor deposition of a radiation-crosslinkable monomer cured by, for example, using an electron beam apparatus, UV light source, electrical discharge apparatus or other suitable device.

In some embodiments, the barrier stack 130 may include one or more polymer layers 132, and one or more inorganic barrier layers 134 arranged in various orders. The barrier stack 130 may be disposed on the thermoplastic polymer skin layer 120 to form a structure of, for example, in some embodiments, skin layer 120/polymer layer/inorganic barrier layer; in some embodiments, the structure may be skin layer 120/inorganic barrier layer/polymer layer; in some embodiments, a preferred structure may be skin layer 120/first polymer layer/inorganic barrier layer/second polymer layer where the first and second polymer layers may have the same or different compositions.

Exemplary useful barrier stacks may include inorganic films prepared by, for example, atomic layer deposition (ALD), thermal evaporation, sputtering, chemical vapor deposition (CVD), plasma enhanced CVD, etc. Useful barrier stacks can be typically flexible and transparent. In some embodiments, useful barrier stacks may include inorganic/organic multilayers. Flexible ultra-barrier films including inorganic/organic multilayers are described, for example, in U.S. Patent Publication No. 2012/0003451 (Weigel et al.), U.S. Pat. No. 5,440,446 (Shaw et al.), U.S. Pat. No. 6,231,939 (Shaw et al.), U.S. Pat. No. 7,980,910 (Padiyath et al.), and PCT Patent Publication No. WO/2014/028678 (Nachtigal et al.), which are incorporated herein by reference.

The inorganic barrier layer 134 is in intimate contact with the polymer layer 132 on the side opposite to the thermoplastic polymer skin layer 120. The inorganic barrier layer 134 can be formed from a variety of materials including, for example, metals, metal oxides, metal nitrides, metal carbides, metal oxynitrides, metal oxyborides, and combinations thereof. Exemplary metal oxides include silicon oxides such as silica, aluminum oxides such as alumina, titanium oxides such as titania, indium oxides, tin oxides, indium tin oxide (ITO), tantalum oxide, zirconium oxide, niobium oxide, and combinations thereof. Other exemplary materials include boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. In some embodiments, the inorganic barrier layer may include at least one of ITO, silicon oxide, or aluminum oxide. In some embodiments, with the proper selection of the relative proportions of each elemental constituent, ITO can be electrically conductive. The inorganic barrier layers can be formed, for example, using techniques employed in the thin film deposition art such as sputtering (for example, cathode or planar magnetron sputtering, dual AC planar magnetron sputtering or dual AC rotatable magnetron sputtering), evaporation (for example, resistive or electron beam evaporation and energy enhanced analogs of resistive or electron beam evaporation including ion beam and plasma assisted deposition), chemical vapor deposition, plasma-enhanced chemical vapor deposition, atomic layer deposition, and plating. In some embodiments, the inorganic barrier layers can be formed using sputtering, for example, reactive sputtering Enhanced barrier properties may be observed when the inorganic layer is formed by a high energy deposition technique such as sputtering compared to lower energy techniques such as conventional vapor deposition processes. Without being bound by theory, it is believed that the enhanced properties are due to the condensing species arriving at the substrate with greater kinetic energy, leading to a lower void fraction as a result of compaction.

In some embodiments, the inorganic barrier layers can be formed using atomic layer deposition (ALD) Enhanced barrier properties may be observed with a low defect incidence associated with this deposition method.

The polymer layer 132 and the inorganic barrier layer 134 can be called a dyad. While only one dyad (i.e., the polymer layer 132 and inorganic barrier layer 134 in FIG. 3B) is shown for the barrier stack 130, it is to be understood that the barrier stack 130 may include additional alternating layers of polymer and inorganic material. Exemplary materials and construction methods for barrier stacks are identified in U.S. Pat. Nos. 5,440,446; 5,877,895; 6,010,751; U.S. Pat. App. Pub. No. 2003/0029493; 69821US002, and 66737US002 (all of which are herein incorporated by reference) and in the Examples of the present disclosure.

Figure 4A:
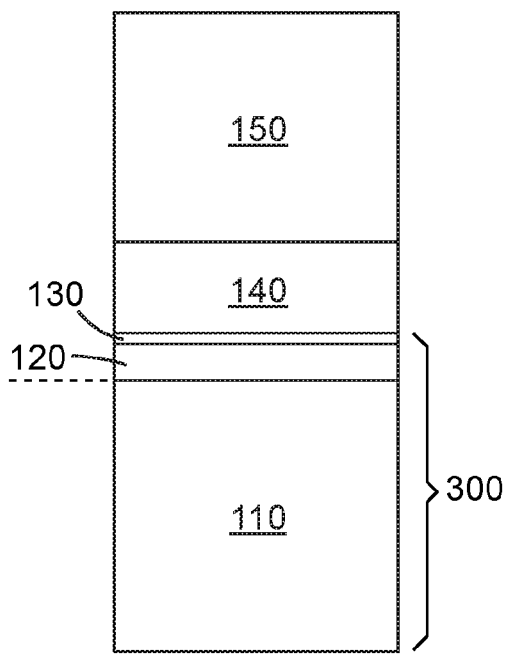
FIG. 4A is a schematic side view of an electronic device by applying the barrier assembly of FIG. 3A to the electronic device, according to one embodiment.

As illustrated in FIG. 4A, the barrier assembly 300 is applied to a major surface of an electronic device 150. The electronic device 150 may include one or more moisture or oxygen sensitive components. The electronic device 150 may be, for example, organic light emitting diodes (OLEDs), or organic and inorganic photovoltaics (PV) that require protection from oxygen and/or water ingress. The barrier stack 130 is laminated to the electronic device 150 by an adhesive layer 140. The thickness of the adhesive layer 140 may vary, for example, from about 0.1 mil to about 1 mil (0.003 mm to 0.03 mm).

In some embodiments, the adhesive layer 140 may be, for example, an optically clear adhesive (OCA), or a barrier adhesive. In some embodiments, the OCA may include any relatively soft pressure sensitive adhesive material that is in situ optically clear. That is, the pressure sensitive adhesive material may, itself, not be optically clear in a free standing condition but once incorporated into the laminate can have an optically clear condition and sufficient adhesion to maintain the layers of the laminate in an unaltered form over any of a wide variety of climatic conditions. The pressure sensitive adhesive compositions can be based on acrylate or acrylic copolymers and terpolymers. In some embodiments, the optically clear adhesives can include, for example, those based on natural rubbers, synthetic rubbers, styrene block copolymers, (meth)acrylic block copolymers, polyvinyl ethers, polyolefins, and poly(meth)acrylates. The terms (meth)acrylate and (meth)acrylic can include both acrylates and methacrylates. Exemplary OCAs are described in WO 2013/025330 (Rotto et al.) which is incorporated herein by reference. In some embodiments, the barrier adhesive may have a composition including a first polyisobutylene resin having a weight average molecular weight of greater than about 300,000 g/mol, and a multifunctional (meth)acrylate monomer. The barrier adhesive composition may be substantially free of tackifier. Exemplary barrier adhesives are described in U.S. Patent Application Publication No. 2011/0105637 (Fujita et al.) which is incorporated herein by reference. In some embodiments, the barrier adhesive may have a composition including a) greater than 50 wt. % of a non-functional isobutylene (co)polymer, b) 0.25 to 20 wt. % of an amine-functional poly(isobutylene) polymer, c) 0 to 10 wt. % of an acid-functional (meth)acrylate copolymer, d) 0 to 40 wt. % of a tackifier; and e) 0 to 40 wt. % of a plasticizer. Exemplary barrier adhesives are described in U.S. Pat. No. 8,663,407 (Joly et al.) which is incorporated herein by reference.

Optionally, the adhesive layer 140 may have a release liner including any conventional sheet material. The release liner can provide protection for the exposed surface of adhesive layer 140. The release liner may have temporary weak adhesion to the surface of adhesive layer 140 to which it is applied, and thus can strip cleanly from the surface to leave an unaltered layer of adhesive for attachment to the surface of the barrier assembly 300.

Figure 4B:
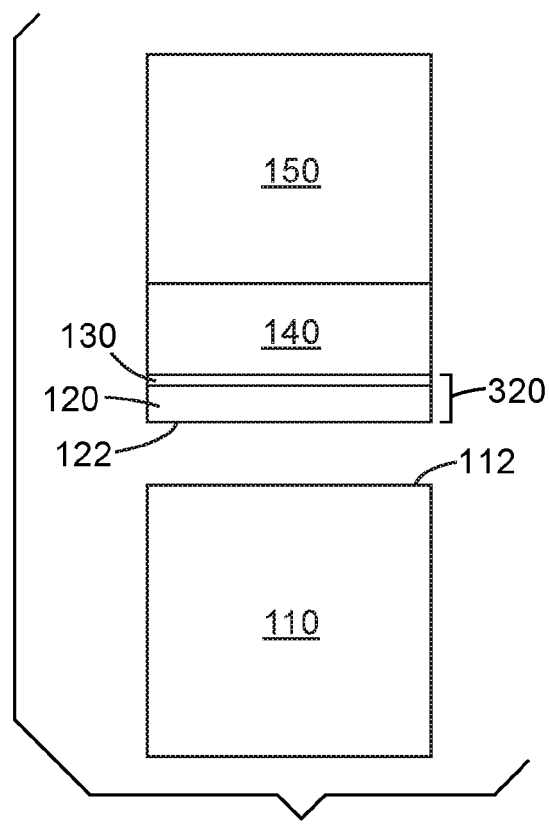
FIG. 4B is a schematic side view of the electronic device of FIG. 4A with the removal of a carrier film resulting in an integral protective layer on the electronic device.
Figure 4C:
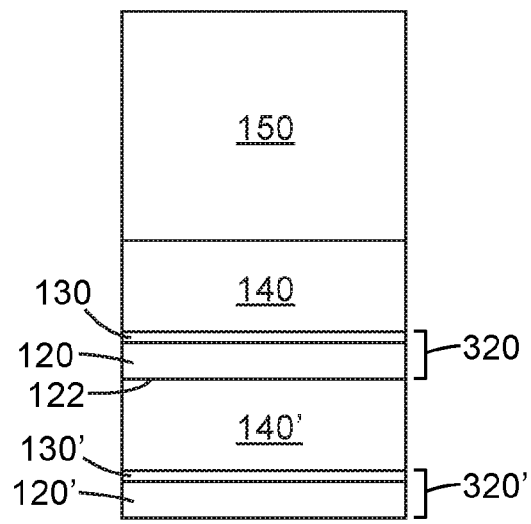
FIG. 4C a schematic side view of the electronic device of FIG. 4B by applying a second integral protective layer to the integral protective layer.

After attaching the barrier assembly 300 to the electronic device 150, the removable carrier film 110 can be removed from the remainder of the barrier assembly 300 by delaminating the removable carrier film 110 along delamination surfaces (e.g., 112 and 122 as shown in FIG. 4B). The integral protective layer 320 including the thermoplastic polymer skin layer 120 and the barrier stack 130, remains on the major surface of the electronic device 150 to provide protection. In the same manner, a second integral protective layer 320' can be attached to the major surface 122 of the first integral protective layer 320 by an adhesive 140'. The second integral protective layer 32' includes a thermoplastic polymer skin layer 120' and a barrier stack 130', which may have the same or different compositions compared to the first integral protective layer 320. In some embodiments, three or more integral protective layers may overlay the major surface of the electronic device 150.

Figure 5:
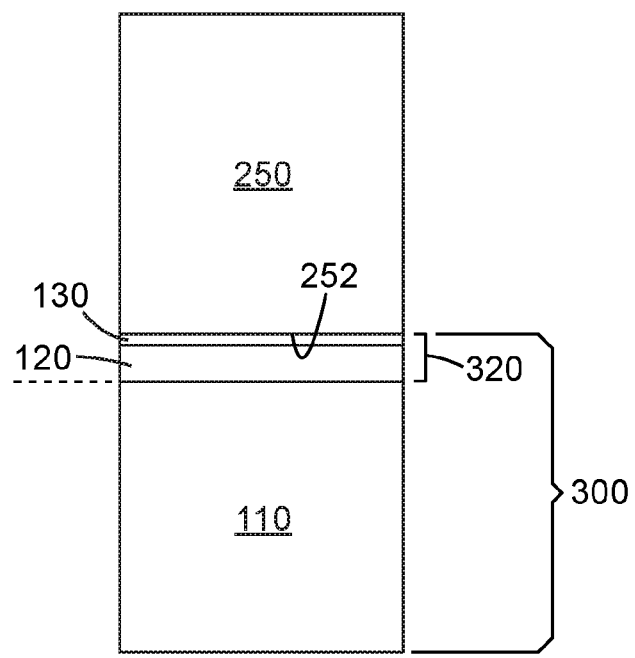
FIG. 5 a schematic side view of an optoelectronic device by directly applying the barrier assembly of FIG. 3A to the electronic device, according to one embodiment.

FIG. 5 illustrates directly applying the barrier assembly 300 to a major surface 252 of an optoelectronic device 250 without using an adhesive. The barrier stack 130 is directly attached to the major surface 252 of the optoelectronic device 250 without any adhesive therebetween. The attachment of the barrier stack 130 to the major surface 252 can be substantially stronger than the attachment of the removable carrier film 110 to the thermoplastic polymer skin layer 120 such that the carrier film 110 tends to irreversibly delaminate from the electronic device 250 along the delamination surface corresponding to the interface between the carrier film 110 and the thermoplastic polymer skin layer 120 (refer to the dashed line in FIG. 5). In some embodiments, the optoelectronic device 250 may be a light converting device where the major surface 252 may be, for example, a polymer matrix layer with quantum dots dispersed therein. The polymer matrix layer may have a thickness, for example, in the range from about 0.1 mil (2.54 microns) to about 10 mil (254 microns). The polymer matrix layer may include, for example, a methacrylate polymer, an epoxy polymer and a photoinitiator. In some embodiments, the polymer matrix layer may be applied to the major surface of a first barrier assembly such as the barrier assembly 300, and a second barrier assembly can be directly attached to the polymer matrix layer on the side opposite to the first barrier assembly. The removable carrier films 110 of the first and second barrier assemblies can be removed at appropriate stages to leave the integral protective layers 320 on the optoelectronic device 250. Exemplary quantum dot films including barrier films and quantum dot layer are described in WO 2014/113562 (Nelson, et al.) which is incorporated herein by reference.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

LISTING OF EXEMPLARY EMBODIMENTS

Embodiment 1 is an article comprising:
 a thermoplastic polymer skin layer having opposite first and second major surfaces;
 a barrier stack coated on the first major surface of the skin layer, the skin layer and the barrier stack forming an integral protective layer, the integral protective layer having a thickness no greater than about 0.5 mil (12.7 microns); and
 a removable carrier film having a major surface releasably attached to the second major surface of the skin layer, the removable carrier film being configured to support the integral protective layer.

Embodiment 2 is the article of embodiment 1, wherein the barrier stack comprises an inorganic barrier layer and a first crosslinked polymer layer.

Embodiment 3 is the article of embodiment 1 or 2, wherein the removable carrier film is at least 2 times thicker than the integral protective layer.

Embodiment 4 is the article of any one of embodiments 1-3, wherein the thickness of the integral protective layer is in the range from about 0.01 mil (0.254 microns) to about 0.5 mil (12.7 microns).

Embodiment 5 is the article of any one of embodiments 1-4, wherein the thickness of the thermoplastic polymer skin layer is in the range from about 0.01 mil (0.254 microns) to about 0.5 mil (12.7 microns).

Embodiment 6 is the article of any one of embodiments 1-5, wherein the thickness of the barrier stack is in the range from about 5 nm to about 10 microns.

Embodiment 7 is the article of any one of embodiments 1-6, wherein the thermoplastic polymer skin layer comprises one or more thermoplastic polymers selected from the group consisting of polyester, polyolefin, polyacrylate, polyamide, polycarbonate, polyurethane, and polystyrene.

Embodiment 8 is the article of embodiment 7, wherein the thermoplastic polymer skin layer includes polyethylene terephthalate (PET) or polyethylene naphthalate (PEN).

Embodiment 9 is the article of any one of embodiments 1-8, wherein the removable carrier film comprises a stack of polymer layers including a frontmost layer attached to the second major surface of the skin layer and an interior layer attached to the frontmost layer on the opposite side thereof.

Embodiment 10 is the article of embodiment 9, wherein the frontmost layer has a polymer composition B comprising a blend of propylene copolymer and styrenic block copolymer, a blend of propylene copolymer and an ethylene alpha olefin copolymer, or a blend of propylene copolymer and an olefin block copolymer.

Embodiment 11 is the article of embodiment 9 or 10, wherein the interior layer has a polymer composition A comprising a semi-crystalline polyester.

Embodiment 12 is the article of any one of embodiments 9-11, wherein the frontmost layer is attached to the interior layer via an interlayer layer therebetween having a composition C, the frontmost layer has a weaker attachment to the second major surface of the skin layer than to the interior layer such that the removable carrier film tends to irreversibly delaminate from the integral protective layer along a delamination surface corresponding to an interface between the frontmost layer and the skin layer.

Embodiment 13 is the article of embodiment 12, wherein the attachment of the frontmost polymer layer to the second major surface of the skin layer is characterized by a first peel force, and wherein the attachment of the frontmost polymer layer to the underlying layer is characterized by a second peel force, and wherein the second peel force is at least two times the first peel force.

Embodiment 14 is the article of any one of embodiments 1-13, wherein the integral protective layer has a water vapor transmission rate (WVTR) less than about 0.005 g/m$^2$/day at 38° C. and 100% relative humidity.

Embodiment 15 is an optoelectronic device, comprising a major surface, and the article of any one of embodiments 1-14, the barrier stack of the article being attached to the major surface of the optoelectronic device.

Embodiment 16 is an optoelectronic device comprising:
 a major surface;
 a thermoplastic polymer skin layer having opposite first and second major surfaces;
 a barrier stack coated on the first major surface of the skin layer, the skin layer and the barrier stack forming an integral protective layer, the integral protective layer having a thickness no greater than about 0.5 mil (12.7 microns),
 wherein the barrier stack is attached to the major surface of the optoelectronic device.

Embodiment 17 is the optoelectronic device of embodiment 15 or 16, wherein the major surface of the optoelectronic device is not a glass surface.

Embodiment 18 is the optoelectronic device of any one of embodiments 15-17, further comprising an adhesive layer, and the barrier stack is attached to the major surface of the optoelectronic device by the adhesive layer.

Embodiment 19 is the optoelectronic device of embodiment 18, wherein the adhesive layer includes an optical clear adhesive or a barrier adhesive.

Embodiment 20 is the optoelectronic device of any one of embodiments 15-19, which is an organic light-emitting diode (OLED) device comprising a major surface, and the barrier stack is attached to the major surface of the OLED via the adhesive layer.

Embodiment 21 is the optoelectronic device of any one of embodiments 15-20, which is a light converting device comprising a polymer matrix layer having quantum dot particles embedded in the polymer matrix layer, the major surface being the surface of the polymer matrix layer, wherein the barrier stack is directly attached to the surface of the polymer matrix layer without any adhesive therebetween.

Embodiment 22 is the method of using the article of any one of embodiments 1-14, comprising:
 providing a substrate;
 attaching the integral protective layer of the article of embodiment 1 to the substrate; and
 removing the removable carrier film from the integral protective layer.

Embodiment 23 is a method comprising:
providing a removable carrier film having a major surface;
providing a thermoplastic polymer skin layer disposed on the major surface of the removable carrier film, the thermoplastic polymer skin layer having opposite first and second major surfaces, and the second major surface of the thermoplastic polymer skin layer being releasably attached to the major surface of the removable carrier film; and
coating a barrier stack on the first major surface of the skin layer, wherein the thermoplastic polymer skin layer and the barrier stack form an integral protective layer having a thickness no greater than about 0.5 mil (12.7 microns).

Embodiment 24 is the method of embodiment 23, further comprising removing the removable carrier film from the integral protective layer by delamination along an interface therebetween.

Embodiment 25 is the method of embodiment 23 or 24, wherein the barrier stack comprises an inorganic barrier layer and a crosslinked polymer layer, and the crosslinked polymer layer is disposed on the first major surface of the thermoplastic polymer skin layer.

Embodiment 26 is the method of any one of embodiments 23-25, wherein the removable carrier film is at least 2 times thicker than the integral protective layer.

Embodiment 27 is the method of any one of embodiments 23-26, wherein the thickness of the integral protective layer is in the range from about 0.01 mil (0.254 microns) to about 0.5 mil (12.7 microns).

Embodiment 28 is the method of any one of embodiments 23-27, wherein the thickness of the thermoplastic polymer skin layer is in the range from about 0.01 mil (0.254 microns) to about 0.5 mil (12.7 microns).

Embodiment 29 is the method of any one of embodiments 23-28, wherein the thickness of the barrier stack is in the range from about 5 nm to about 10 microns.

Embodiment 30 is the method of any one of embodiments 23-29, wherein the thermoplastic polymer skin layer comprises one or more thermoplastic polymers selected from the group consisting of polyester, polyolefin, polyacrylate, polyamide, polycarbonate, polyurethane, and polystyrene.

Embodiment 31 is the method of embodiment 30, wherein the thermoplastic polymer skin layer includes polyethylene terephthalate (PET) or polyethylene naphthalate (PEN).

Embodiment 32 is the method of embodiment 30 or 31, wherein the removable carrier film comprises a stack of polymer layers including a frontmost layer attached to the second major surface of the skin layer and an interior layer attached to the frontmost layer on the opposite side thereof.

Embodiment 33 is the method of embodiment 32, wherein the frontmost layer has a polymer composition B comprising a blend of propylene copolymer and styrenic block copolymer, a blend of propylene copolymer and an ethylene alpha olefin copolymer, or a blend of propylene copolymer and an olefin block copolymer.

Embodiment 34 is the method of embodiment 32 or 33, wherein the interior layer has a polymer composition A comprising a semi-crystalline polyester Embodiment 35 is the method of any one of embodiments 32-34, wherein the frontmost layer is attached to the interior layer via an interlayer layer therebetween having a composition C, the frontmost layer has a weaker attachment to the second major surface of the skin layer than to the interior layer such that the removable carrier film tends to irreversibly delaminate from the integral protective layer along a delamination surface corresponding to an interface between the frontmost layer and the skin layer.

Embodiment 36 is the method of embodiment 35, wherein the attachment of the frontmost polymer layer to the second major surface of the skin layer is characterized by a first peel force, and wherein the attachment of the frontmost polymer layer to the underlying layer is characterized by a second peel force, and wherein the second peel force is at least two times the first peel force.

Embodiment 37 is the method of any one of embodiments 23-36, wherein the integral protective layer has a water vapor transmission rate (WVTR) less than about 0.005 $g/m^2/day$ at 38° C. and 100% relative humidity.

Embodiment 38 is the article of embodiment 2, wherein the first crosslinked polymer layer is disposed on the first major surface of the thermoplastic polymer skin layer, and the inorganic barrier layer is disposed on the first crosslinked polymer layer.

Embodiment 39 is the article of embodiment 38, wherein the barrier stack further comprises a second crosslinked polymer layer, and the inorganic barrier layer is sandwiched by the first and second crosslinked polymer layer.

Embodiment 40 is the article of embodiment 2, wherein the inorganic barrier layer is disposed on the first major surface of the thermoplastic polymer skin layer, and the first crosslinked polymer layer is disposed on the inorganic barrier layer.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. In addition, Table 1 provides abbreviations and a source for all materials used in the Examples below:

TABLE 1

| Abbreviation | Description | Source |
| --- | --- | --- |
| PET | polyethylene terephthalate (PET) resin having an intrinsic viscosity 0.60 | 3M Company, St. Paul, MN, USA |
| PP | polypropylene/polyethylene copolymer | product code PP8650 from Total Petrochemicals, Inc., Houston, TX, USA |
| SEBS | styrene (ethylene/butylene) styrene block copolymer resin | product code KRATON G1657 from Kraton Performance Polymers Inc., Houston, TX, USA |

TABLE 1-continued

| Abbreviation | Description | Source |
| --- | --- | --- |
| SARTOMER SR883s | liquid tricyclodecane dimethanol diacrylate | Sartomer USA, LLC, Exton, PA, USA |
| DYNASYLAN 1189 | N-(n-butyl)-3-aminopropyltrimethoxysilane | Evonik, Essen, DE |
| Sputter targets | 90% Si/10% Al targets | Soleras Advanced Coatings US, Biddeford, ME, USA |
| SAM.24 | Bis(diethylamino)silane ($C_8H_{22}N_2Si$) | Air Liquide, Philadelphia, PA, USA |
| TMA | Trimethyl Aluminum | Strem Chemicals, Inc. Newburyport, MA, USA |
| KF4 | UV curable acrylate | Van Technologies Inc Duluth, MN, USA |

Test Methods

The following test methods have been used in evaluating some of the Examples of the present disclosure.

Moisture barrier performance was measured using a calcium corrosion test, as described below. First, a thin, opaque, reflective layer (about 100 nm thick) of metallic calcium was thermally evaporated onto a glass slide, within an inert environment to prevent premature corrosion. At the same time, a sheet of barrier adhesive was laminated to Examples. Then, samples with the adhesive was laminated to the Ca-coated glass slide. Then the slide was exposed to 60 C/90% RH and the slide was examined using a high resolution optical scanner at different points in time during aging. As moisture penetrates the protective layer, it corrodes the metallic calcium, converting the metallic calcium from an opaque material to a transparent oxide. The optical scanner interprets this reaction as loss in optical density of the slide, and this property is correlated to water vapor transmission rate (WVTR).

The WVTR of some samples was also measured using a MOCON PERMATRAN-W® 700 WVTR testing system (commercially available from MOCON Inc., Minneapolis, Minn.). Four inch diameter samples were cut from sheets of coated film and loaded into the instrument, which was set to challenge one side of the film with 100% RH at 50° C. until a steady state measurement of WVTR was attained. The lowest limit of detection of this instrument is about 0.005 g/m²/day.

EXAMPLES

Example 1

In Example 1, a carrier film substrate with a thermoplastic polymer thin skin layer was made by forming multilayered polymer films having the structure similar as shown in FIG. 2. A five-layer stack was formed with a symmetric structure of layer A (0.2 mil or 5 microns)/layer B (0.5 mil or 12.7 microns)/layer A (0.5 mil or 12.7 microns)/layer B (0.5 mil or 12.7 microns)/layer A (0.2 mil or 5 microns). The upmost layer A (0.2 mil or 5 microns) was the thermoplastic polymer thin skin layer that is removable from the underlying layer B (0.5 mil or 12.7 microns) as discussed herein. The layers A and B have polymer compositions A and B, respectively, which were coextrudable with each other, and were all melt processable at a temperature of 204° C. (400° F.) or greater. The extruders, die, and feedblock were heated to temperatures of 500 to 530° F. (260 to 277° C.) during the extrusion of the samples described in these examples. The following polymer compositions and extruder flow rates were used:

polymer composition A: PET resin of intrinsic viscosity 0.60, at a flow rate of about 82 kg/hour; and polymer composition B: a blend of a polypropylene/polyethylene copolymer (product code PP8650 from Total Petrochemicals, Inc., Houston, Tex., USA), at about 90 wt % (flow rate of about 57 kg/hour)), and a styrene (ethylene/butylene) styrene (SEBS) block copolymer resin (product code KRATON G1657 from Kraton Performance Polymers Inc., Houston, Tex., USA), at about 10 wt % (flow rate of 6.3 kg/hour)).

TABLE 2

| Layer | Material | Rate (kg/hour) |
| --- | --- | --- |
| A | PET | 18.2 |
| B | Blend of 90 wt % PP and 10 wt % SEBS | 28.6 kg/hour PP + 3.2 kg/hour G1657 |
| A | PET | 45.5 |
| B | Blend of 90 wt % PP and 10 wt % SEBS | 28.6 kg/hour PP + 3.2 kg/hour G1657 |
| A | PET | 18.2 |

The above Table 2 lists polymer compositions and extruder flow rates for a five-layer stack with a symmetric structure of layer A (0.2 mil or 5 microns)/layer B (0.5 mil or 12.7 microns)/layer A (0.5 mil or 12.7 microns)/layer B (0.5 mil or 12.7 microns)/layer A (0.2 mil or 5 microns).

Barrier films or coatings were prepared by covering a substrate of the construction described above with a stack of a base polymer layer (Layer 1), an inorganic silicon aluminum oxide (SiAlOx) barrier layer (Layer 2), and a protective polymeric layer (Layer 3) in a vacuum coater similar to the coater described in U.S. Pat. No. 5,440,446 (Shaw et al.) and U.S. Pat. No. 7,018,713 (Padiyath, et al.), both of which are incorporated herein by reference. The individual layers were formed as follows:

Layer 1 (a base polymer layer): a 366 mm wide film of indefinite length was loaded into a roll-to-roll vacuum processing chamber. The chamber was pumped down to a pressure of $2 \times 10^{-5}$ Torr. A web speed of 4.9 meter/min was held while maintaining the backside of the film in contact with a coating drum chilled to −10° C. With the backside in contact with the drum, the film frontside surface was treated with a nitrogen plasma at 0.02 kW of plasma power. The film frontside surface was then coated with tricyclodecane dimethanol diacrylate monomer (obtained under the trade designation "SR833S", from Sartomer USA, Exton, Pa.). The monomer was degassed under vacuum to a pressure of 20 mTorr prior to coating, loaded into a syringe pump, and pumped at a flow rate of 1.33 mL/min through an ultrasonic atomizer operating at a frequency of 60 kHz into a heated vaporization chamber maintained at 260° C. The resulting monomer vapor stream condensed onto the film surface and was electron beam crosslinked using a multi-filament electron-beam cure gun operating at 7.0 kV and 4 mA to form a 750 nm thick base polymer layer.

Layer 2 (an inorganic layer): immediately after the base polymer layer deposition and with the backside of the film still in contact with the drum, a SiAlOx layer was sputter-deposited atop the base polymer layer. Two alternating current (AC) 40 kHz power supplies were used to control two pairs of cathodes; with each cathode housing two 90% Si/10% Al sputtering targets (obtained from Soleras Advanced Coatings US, of Biddeford, Me.). During sputter deposition, the voltage signal from each power supply was used as an input for a proportional-integral-differential control loop to maintain a predetermined oxygen flow to each cathode. The sputtering conditions were: AC power 16 kW, with a gas mixture containing 350 standard cubic centimeter per minute (sccm) argon and 213 sccm oxygen at a sputter pressure of 3.5 mTorr. This provided a 24 nm thick SiAlOx layer deposited atop the base polymer layer (Layer 1).

Layer 3 (a protective polymeric layer): immediately after the SiAlOx layer deposition and with the film still in contact with the drum, a second acrylate was coated and crosslinked using the same general conditions as for Layer 1, but with these exceptions: (1) Electron beam crosslinking was carried out using a multi-filament electron-beam cure gun operated at 7 kV and 10 mA. This provided a 750 nm acrylate layer atop Layer 3. (2) The protective polymeric layer contained 3 wt % of N-(n-butyl)-3-aminopropyltrimethoxysilane (obtained as DYNASYLAN 1189 from Evonik of Essen, Del.) with the remainder SARTOMER SR833S. This construction of the barrier coating on the full film substrate construction exhibits WVTR below the Mocon Permatran water vapor detection limit (i.e., <0.005 g/m$^2$/day).

After the coating of the barrier stack and laminating to the Ca-coated glass slide, unwanted layers, i.e., the carrier film substrate of layer B (0.5 mil or 12.7 microns)/layer A (0.5 mil or 12.7 microns)/layer B (0.5 mil or 12.7 microns)/layer A (0.2 mil or 5 microns), were peeled away to provide an ultrathin protective layer (i.e., the thin skin layer A plus the barrier stack) to the Ca-coated glass slide, resulting a structure of PET (0.2 mil or 5 microns)/barrier stack (0.06 mil or 15 microns)/adhesive/Calcium/glass.

Calcium corrosion test samples were made from Example 1, as described above. Calcium corrosion tests were conducted for Example 1 before and after the carrier film substrate was peeled away. The entire multilayer films (e.g., carrier film, skin layer, barrier stack, and adhesive) were aged from 0 to 213 hours, with little loss of the calcium observed. Then, the carrier film was removed without causing damage to the skin layer and the barrier stack. Finally, the sample was aged again for an additional 65 hours, showing little additional calcium loss. Example 1 was also tested by peeling the carrier film substrate immediately after lamination, and aged as such. The observed calcium corrosion shows the same behavior.

Examples 2

Example 2 was prepared by combining a barrier coating applied to a 2 mil (51 microns) PET substrate with Example 1, respectively. Example 2 was laminated with adhesive to a calcium-coated glass slide, resulting in a structure of 2 mil PET/0.06 mil barrier stack/adhesive/0.2 mil PET/0.06 mil barrier stack/adhesive/Calcium/glass.

Example 3

Example 3 was prepared by combining two layers of barrier-coated 0.2 mil PET. Example 3 was laminated with adhesive to a calcium-coated glass slide, resulting in a structure of 0.2 mil PET/0.06 mil barrier stack/adhesive/0.2 mil PET/0.06 mil barrier stack/adhesive/Calcium/glass.

Comparative Example A

Comparative Example A was prepared by disposing a single barrier stack (three-layer construction of polymer layer/oxide layer/polymer layer) on a 2 mil PET substrate, and then laminating with adhesive to a calcium-coated glass slide, resulting in a structure of 2 mil PET/0.06 mil barrier stack/adhesive/Calcium/glass.

Comparative Example B

Comparative Example B was prepared based on Comparative Example A, by disposing a second barrier on a second 2 mil PET substrate, and then laminated to a calcium slide, resulting in a structure of 2 mil PET/0.06 mil barrier stack/adhesive/2 mil PET/0.06 mil barrier stack/adhesive/Calcium/glass.

Examples 1', 2' and 3'

Examples 1', 2' and 3' have the same structure and composition as the respective Examples 1, 2 and 3 except that barrier films or coatings were prepared as follows.

Barrier films or coatings were prepared by covering a substrate of the construction described above with a stack of an inorganic silicon aluminum oxide (SiAlOx) barrier layer (Layer 1), and a protective polymeric layer (Layer 2) in a vacuum coater similar to the coater described in U.S. Pat. No. 8,187,679 and US Patent Application No. 2014/0242736 which is incorporated herein by reference. The individual layers were formed as follows:

Layer 1 (an inorganic silicon aluminum oxide (SiAlOx) barrier layer): an 11 nm film of amorphous SiAlOx deposited by Atomic Layer Deposition (ALD) by a process described in U.S. Pat. No. 8,187,679 and US Patent Application No. 2014/0242736 wherein a 100 mm wide film of indefinite length was loaded into a vacuum processing chamber and pumped down to a pressure of 0.01 Torr and heated to a temperature of 100° C. Prior to deposition the film was exposed to an oxygen plasma at a power of 200 W for approximately 3 seconds. During the deposition, a web speed of 30 meter/min and a chamber pressure of 1.4 Torr was maintained while the film was cyclically exposed to 0.1 Torr partial pressure of the first ALD precursor (precursor 1) commercially available from Air Liquide, Philadelphia, Pa. under the trade name SAM.24 followed by exposure to a 450 W plasma generated from a 70/30 weight percent mixture of nitrogen and carbon dioxide, followed by exposure to 0.1 Torr partial pressure of the second ALD precursor (precursor 2, trimethyl aluminum or TMA) commercially available from STREM chemicals Inc., Newburyport, Mass., followed by exposure to a 450 W plasma generated from a 70/30 weight percent mixture of nitrogen and carbon dioxide. The geometry of the system is such that exposure to precursor zones 1 and 2 was approximately 1.3 seconds and the exposure to the plasma was approximately 0.3 seconds. This process cycle was repeated for 27 revolutions, resulting in an ultimate SiAlOx film thickness of 11 nm.

Layer 2 (a protective polymer layer) was deposited by a method described in "B. L. Danforth, E. R. Dickey/Surface & Coatings Technology 241 (2014) 142-147)" wherein a 1 micron layer of UV curable acrylate commercially available from Van Technologies Inc., Duluth, Minn., under the trade name KF4, was deposited atop layer 1 by spin-coating for 30 seconds at 4000 rotations per minute after approximately 5 milliliters of KF4 was delivered to the surface. The resulting liquid film was cured with a Dymax 5000-EC UV-light curing station at a power density of 400 Watts per inch for 5 minutes. This construction of the barrier coating on the full film substrate construction exhibited WVTR of 0.01 g/m$^2$/day as measured by a PERMATRAN-W 700 WVTR instrument from Mocon Inc., Minneapolis, Minn., at 50° C. and 100% RH.

Calcium test results for Examples 1, 1', 2 and 2', and Comparative Examples A and B clearly show that the laminated ultrathin protective layers (Examples 1a-b and 2a-b) provide much better resistance to calcium corrosion (i.e. WVTR) than the single barrier-coated 2 mil PET (Comparative Example A), and provide similar performance to the double 2 mil PET example (Comparative Example B). Examples 1, 1', 2 and 2' have much less PET in the final construction compared to Comparative Example B.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. An article comprising:
a thermoplastic polymer skin layer having opposite first and second major surfaces;
a barrier stack coated on the first major surface of the thermoplastic polymer skin layer, the thermoplastic polymer skin layer and the barrier stack forming an integral protective layer, the integral protective layer having a thickness no greater than about 0.5 mil (12.7 microns); and
a removable carrier film having a major surface releasably attached to the second major surface of the thermoplastic polymer skin layer, the removable carrier film being configured to support the integral protective layer.

2. The article of claim 1, wherein the removable carrier film is at least 2 times thicker than the integral protective layer.

3. The article of claim 1, wherein the thickness of the integral protective layer is in the range from about 0.01 mil (0.254 microns) to about 0.5 mil (12.7 microns).

4. The article of claim 1, wherein the thickness of the thermoplastic polymer skin layer is in the range from about 0.01 mil (0.254 microns) to about 0.5 mil (12.7 microns).

5. The article of claim 1, wherein the thickness of the barrier stack is in the range from about 5 nm to about 10 microns.

6. The article of claim 1, wherein the integral protective layer has a water vapor transmission rate (WVTR) less than about 0.005 $g/m^2$/day at 38° C. and 100% relative humidity.

7. The article of claim 1, wherein the attachment of the barrier stack to the thermoplastic polymer skin layer is substantially stronger than the attachment of the removable carrier film to the thermoplastic polymer skin layer such that the integral protective layer tends to delaminate along a delamination surface corresponding to an interface between the removable carrier film and the thermoplastic polymer skin layer.

8. The article of claim 1, wherein the barrier stack comprises an inorganic barrier layer and a first crosslinked polymer layer.

9. The article of claim 8, wherein the first crosslinked polymer layer is disposed on the first major surface of the thermoplastic polymer skin layer, and the inorganic barrier layer is disposed on the first crosslinked polymer layer.

10. The article of claim 9, wherein the barrier stack further comprises a second crosslinked polymer layer, and the inorganic barrier layer is sandwiched by the first and second crosslinked polymer layers.

11. The article of claim 1, wherein the removable carrier film comprises a stack of polymer layers including a frontmost layer attached to the second major surface of the thermoplastic polymer skin layer and an interior layer attached to the frontmost layer on the opposite side thereof.

12. The article of claim 11, wherein the frontmost layer is attached to the interior layer via an interlayer layer therebetween having a composition C, the frontmost layer has a weaker attachment to the second major surface of the thermoplastic polymer skin layer than to the interior layer such that the removable carrier film tends to irreversibly delaminate from the integral protective layer along a delamination surface corresponding to an interface between the frontmost layer and the thermoplastic polymer skin layer.

13. The article of claim 12, wherein the attachment of the frontmost polymer layer to the second major surface of the thermoplastic polymer skin layer is characterized by a first peel force, and wherein the attachment of the frontmost polymer layer to the underlying layer is characterized by a second peel force, and wherein the second peel force is at least two times the first peel force.

14. An optoelectronic device, comprising a major surface, and the article of claim 1, the barrier stack of the article being attached to the major surface of the optoelectronic device.

15. A method comprising:
providing a removable carrier film having a major surface;
providing a thermoplastic polymer skin layer disposed on the major surface of the removable carrier film, the thermoplastic polymer skin layer having opposite first and second major surfaces, and the second major surface of the thermoplastic polymer skin layer being releasably attached to the major surface of the removable carrier film; and
coating a barrier stack on the first major surface of the thermoplastic polymer skin layer, wherein the thermoplastic polymer skin layer and the barrier stack form an integral protective layer having a thickness no greater than about 0.5 mil (12.7 microns).

16. The method of claim 15, further comprising removing the removable carrier film from the integral protective layer by delamination along an interface therebetween.

17. The method of claim 15, wherein the attachment of the barrier stack to the thermoplastic polymer skin layer is substantially stronger than the attachment of the removable carrier film to the thermoplastic polymer skin layer such that the integral protective layer tends to delaminate along a delamination surface corresponding to an interface between the removable carrier film and the thermoplastic polymer skin layer.

18. The method of claim 15, wherein the removable carrier film is at least 2 times thicker than the integral protective layer.

\* \* \* \* \*